(12) United States Patent
Kim

(10) Patent No.: US 11,581,057 B2
(45) Date of Patent: Feb. 14, 2023

(54) MEMORY DEVICE AND METHOD OF OPERATING THE SAME

(71) Applicant: SK hynix Inc., Icheon-si (KR)

(72) Inventor: Seong Uk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 73 days.

(21) Appl. No.: 17/161,260

(22) Filed: Jan. 28, 2021

(65) Prior Publication Data

US 2022/0036959 A1 Feb. 3, 2022

(30) Foreign Application Priority Data

Jul. 28, 2020 (KR) .................. 10-2020-0094067

(51) Int. Cl.
*G11C 29/44* (2006.01)
*G11C 29/10* (2006.01)
*G11C 29/14* (2006.01)

(52) U.S. Cl.
CPC ............. *G11C 29/44* (2013.01); *G11C 29/10* (2013.01); *G11C 29/14* (2013.01); *G11C 2029/4402* (2013.01)

(58) Field of Classification Search
CPC ......... G11C 29/44; G11C 29/10; G11C 29/14; G11C 2029/4402
See application file for complete search history.

(56) References Cited

U.S. PATENT DOCUMENTS

| 6,144,577 A * | 11/2000 | Hidaka ................ | G11C 29/808 365/230.03 |
| 6,421,789 B1 * | 7/2002 | Ooishi .................. | G11C 29/14 714/6.32 |
| 6,668,345 B1 * | 12/2003 | Ooishi ................. | G11C 29/824 714/710 |
| 2009/0219774 A1 * | 9/2009 | Kim ...................... | G11C 29/28 365/201 |

FOREIGN PATENT DOCUMENTS

| KR | 1020170055222 A | 5/2017 |
| KR | 1020190114701 A | 10/2019 |

* cited by examiner

*Primary Examiner* — Tuan T Nguyen
(74) *Attorney, Agent, or Firm* — William Park & Associates Ltd.

(57) ABSTRACT

A memory device includes a system block for storing test information and includes a data block including memory cells connected to a plurality of low bank column lines and a plurality of high bank column lines. The memory device also includes a column repair controller configured to detect, based on the test information, a concurrent repair column line in which a low bank column line among the plurality of low bank column lines and a high bank column line the plurality of high bank column lines corresponding to the same column address are concurrent repaired.

14 Claims, 17 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0094067, filed on Jul. 28, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device, such as a computer or a smartphone. A storage device may include a memory device in which data is stored and a memory controller to control the memory device. The memory device may be a volatile memory device or a non-volatile memory device.

A volatile memory device is a device that stores data only when power is supplied and loses the stored data when the power supply is interrupted. A volatile memory device may include static random access memory (SRAM), dynamic random access memory (DRAM), or the like.

A non-volatile memory device is a device that does not lose data even when a supply of power is interrupted. A non-volatile memory device may include read only memory (ROM), programmable ROM (PROM), electrically programmable ROM (EPROM), electrically erasable and programmable ROM (EEPROM), flash memory, or the like.

SUMMARY

An embodiment of the present disclosure may detect a concurrent repair case where a low bank and a high bank of the same column that is not supported by a circuit, are simultaneously repaired, thereby increasing a yield of a memory device.

A memory device according to an embodiment of the present disclosure may include a system block for storing test information and include a data block including memory cells connected to a plurality of low bank column lines and a plurality of high bank column lines. The memory device may also include a column repair controller configured to detect, based on the test information, a concurrent repair column line in which a low bank column line among the plurality of low bank column lines and a high bank column line among the plurality of high bank column lines corresponding to the same column address are concurrent repaired.

A method of operating a memory device including a system block for storing test information and a data block including memory cells connected to a plurality of low bank column lines and a plurality of high bank column lines according to an embodiment of the present disclosure may include: storing packaging test information, which is included in test data stored in the system block, in a first register, storing wafer test information, which is included in the test data stored in the system block, in a second register, and detecting, based on the wafer test information and the packaging test information, a concurrent repair column line in which a low bank column line among the plurality of low bank column lines and a high bank column line the plurality of high bank column lines corresponding to the same column address are concurrent repaired.

A method of operating a memory controller for controlling a memory device according to an embodiment of the present disclosure may include providing a reset command to the memory device, providing a status read command for requesting status information stored in the memory device, receiving the status information from the memory device, and storing information on whether the memory device is defective based on concurrent repair information included in the status information.

According to the present technology, after a packaging test, a concurrent repair case in which a low bank and a high bank of the same column, which are not supported by a circuit, are simultaneously repaired is detected, thereby increasing a yield of a memory device.

DETAILED DESCRIPTION

The advantages and features of the present disclosure, and a method of accomplishing the advantages and features will be described through embodiments that are described in detail below together with the accompanying drawings. However, the present disclosure is not limited to the embodiments described herein but may be embodied in other forms. The present embodiments are provided to describe the technical spirit of the present disclosure in detail to those skilled in the art to which the present disclosure pertains so that those skilled in the art may easily implement the technical spirit of the present disclosure.

Figure 1:
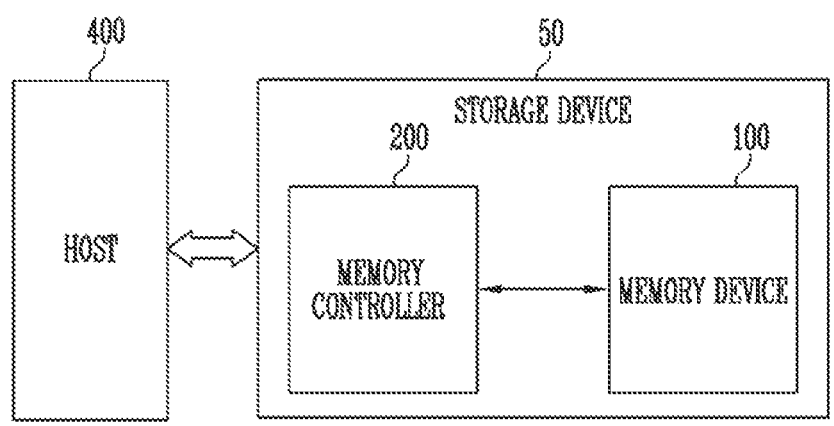
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 is a device that stores data under control of a host 400 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with a host 400. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store the data.

Each of the memory cells may be configured as a single-level cell (SLC) storing one data bit, a multi-level cell (MLC) storing two data bits, a triple-level cell (TLC) storing three data bits, or a quad-level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may include double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 includes NAND flash memory.

The memory device 100 is configured to receive a command and an address from the memory controller 200 and access a region selected by the address of the memory cell array. That is, the memory device 100 may perform an operation instructed by a command on the region selected by the address. For example, the memory device 100 may perform a write operation (program operation), a read operation, and an erase operation. During the program operation, the memory device 100 may program data to the region selected by the address. During the read operation, the memory device 100 may read data from the region selected by the address. During the erase operation, the memory device 100 may erase data stored in the region selected by the address.

The memory controller 200 controls an overall operation of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 400 and the memory device 100.

In an embodiment, the memory controller 200 may receive data and a logical block address (LBA) from the host 400 and convert the LBA into a physical block address (PBA) indicating an address of memory cells in which data included in the memory device 100 is to be stored.

The memory controller 200 may control the memory device 100 to perform the program operation, the read operation, or the erase operation in response to a request from the host 400. During the program operation, the memory controller 200 may provide a write command, the PBA, and the data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the command, the address, and the data to the memory device 100 regardless of the request from the host 400. For example, the memory controller 200 may provide the command, the address, and the data to the memory device 100 so as to perform background operations such as a program operation for wear leveling and a program operation for garbage collection.

In an embodiment, the memory controller 200 may control at least two memory devices 100. In this case, the memory controller 200 may control the memory devices 100 according to an interleaving method so as to improve operation performance. The interleaving method may be an operation method for overlapping operation periods of at least two memory devices 100.

The host 400 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
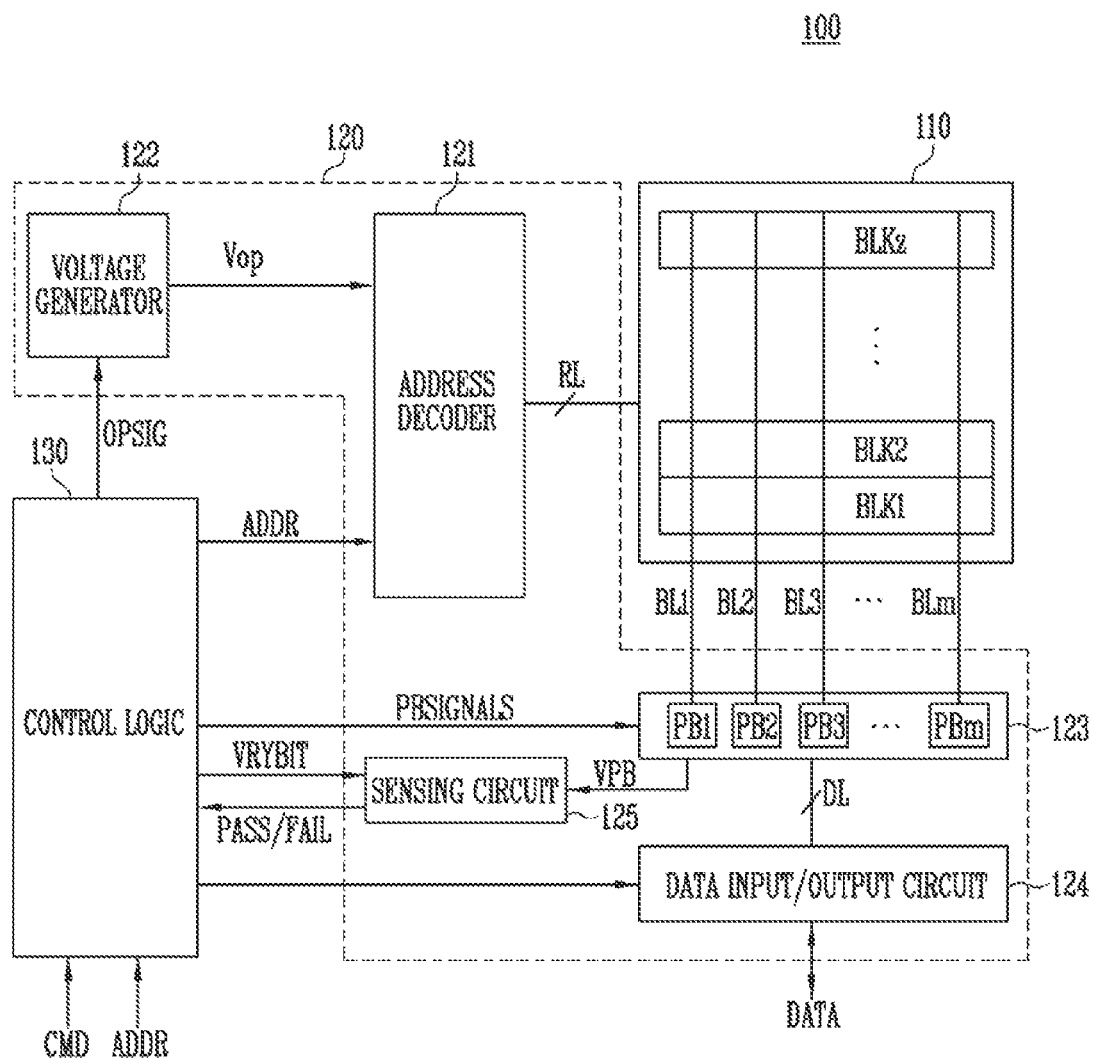
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. The plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single-level cell (SLC) that stores one data bit, a multi-level cell (MLC) that stores two data bits, a triple-level cell (TLC) that stores three data bits, or a quad-level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line among the word lines of the selected memory block according to the decoded row address. The address decoder 121 may apply an operation voltage Vop supplied from the voltage generator 122 to a selected word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

The erase operation of the memory device 100 is performed in a memory block unit. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

The address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

The voltage generator 122 may generate an internal power voltage by regulating the external power voltage. The internal power voltage generated by the voltage generator 122 is used as an operation voltage of the memory device 100.

The voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of dummy program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permit voltage (for example, a ground voltage) is applied may have an increased threshold voltage. A threshold voltage of a memory cell connected to a bit line to which a program inhibit voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be implemented as hardware, software, or a combination of hardware and software. For example, the control logic 130 may be a control logic circuit operating in accordance with an algorithm and/or a processor executing control logic code. The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the permission bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

Figure 3:
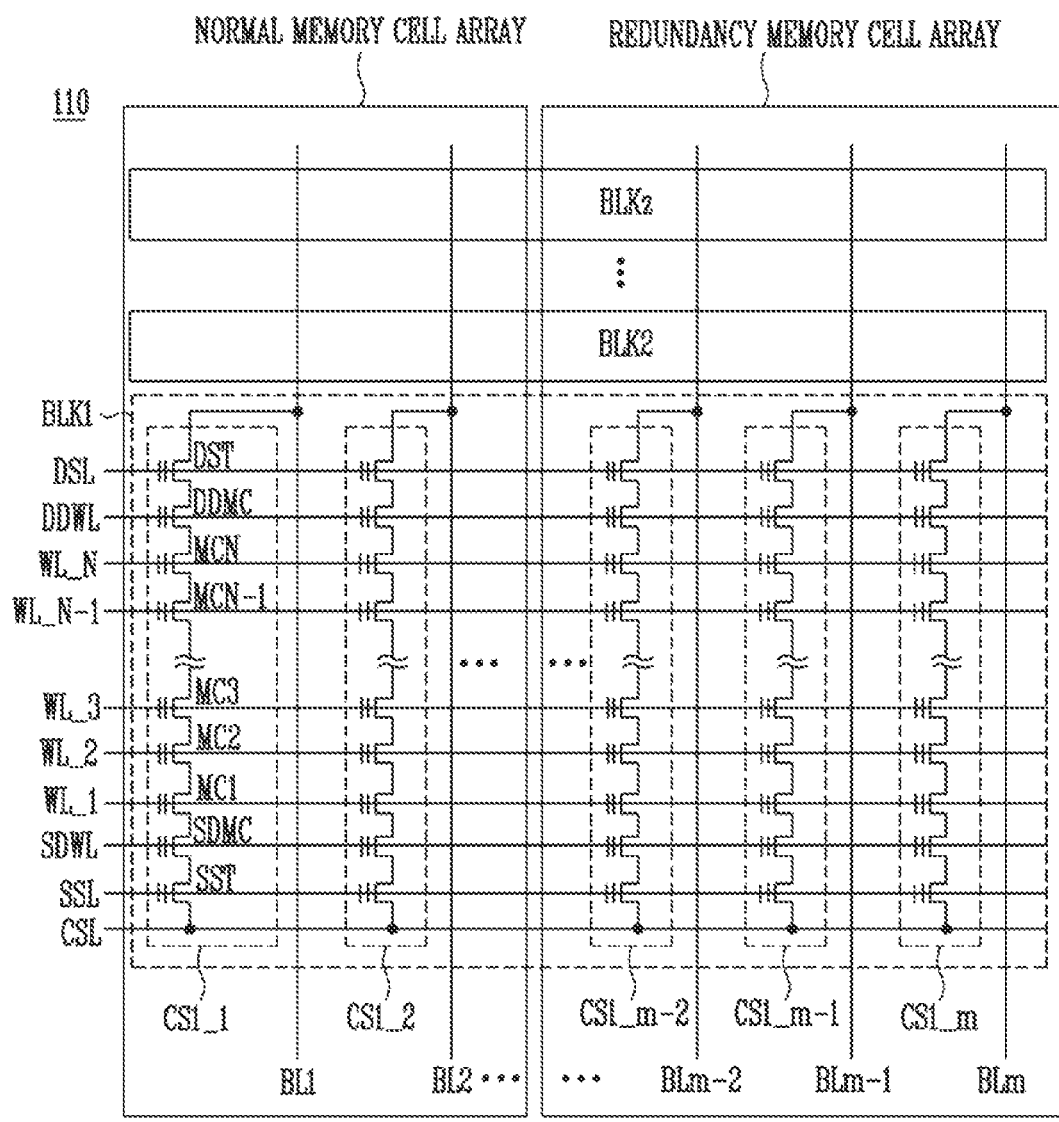
FIG. 3 is a diagram illustrating a memory cell array of FIG. 2.

FIG. 3 is a diagram illustrating the memory cell array of FIG. 2.

Referring to FIG. 3, first to z-th memory blocks BLK1 to BLKz are commonly connected to first to m-th bit lines BL1 to BLm. In FIG. 3, for convenience of description, elements included in the first memory block BLK1 among the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_m (m is a positive integer). The first to m-th cell strings CS1_1 to CS1_m are connected to the first to m-th bit lines BL1 to BLm, respectively. Each of the first to m-th cell strings CS1_1 to CS1_m includes a drain select transistor DST, a drain dummy cell DDMC connected in series, a plurality of memory cells MC1 to MCN (N is a positive integer) connected in series, a source dummy cell SDMC connected in series, and a source select transistor SST.

A gate terminal of the drain select transistor DST included in each of the first to m-th cell strings CS1_1 to CS1_m is connected to a drain select line DSL. A gate terminal of the drain dummy cell DDMC included in each of the first to m-th cell strings CS1_1 to CS1_m is connected to a drain dummy word line DDWL. Gate terminals of the first to N-th memory cells MC1 to MCN included in each of the first to m-th cell strings CS1_1 to CS1_m are connected to first to N-th word lines WL_1 to WL_N. A gate terminal of the source dummy cells SDMC included in each of the first to m-th cell strings CS1_1 to CS1_m is connected to a source dummy word line SDWL, and a gate terminal of the source select transistor SST included in each of the first to m-th cell strings CS1_1 to CS1_m is connected to a source select line SSL.

For convenience of description, a structure of the cell string is described based on the first cell string CS1_1 among the plurality of cell strings CS1_1 to CS1_m. However, it will be understood that each of the remaining cell strings CS1_2 to CS1_m is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the drain dummy cell DDMC included in the first cell string CS1_1. The first to N-th memory cells MC1 to MCN are connected in series with each other. The drain dummy cell DDMC and the N-th memory cell MCN are connected in series, and the first memory cell MC1 is connected to the source dummy cell SDMC in series. A drain terminal of the source select transistor SST included in the first cell string CS1_1 is connected to a source terminal of the source dummy cell SDMC included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL, the drain dummy word line DDWL, the first to N-th word lines WL_1 to WL_N, the source dummy word line SDWL, and the source select line SSL are included in the row lines RL of FIG. 2. The drain select line DSL, the drain dummy word line DDWL, the first to N-th word lines WL_1 to WL_N, the source dummy word line SDWL, and the source select line SSL are controlled by the address decoder 121. The common source line CSL is controlled by the control logic 130. The first to m-th bit lines BL1 to BLm are controlled by the read and write circuit 123.

Some of the first to z-th memory blocks BLK1 to BLKz may be set as a system block. Various data related to an operation of the memory device may be stored in the system block. For example, the data stored in the system block may include meta data, address information of a column to which repaired memory cells are connected, the number of repetitive program loops during the program operation on the memory cells, a magnitude of the verify voltage to be applied to the word line to which the memory cells to be programmed are connected, and the like.

The memory cell array 110 may include a normal memory cell array area including columns to which a plurality of memory cells are connected, and a redundancy memory cell array area including columns to which a plurality of redundancy memory cells are connected. In an embodiment, the redundancy memory cell array area may include a wafer test repair column area and a packaging test repair column area. During a wafer test on the memory device, a defective column may be detected among a plurality of columns included in the normal memory cell array area. The defective column may be referred to as a fail column.

The fail column generated in the normal memory cell array area may be replaced by the column included in the redundancy memory cell array area, and such an operation may be referred to as a repair operation. By the repair operation, write and read operations may be performed on the column to which the redundancy memory cells are connected, instead of write and read operations scheduled to the memory cell connected to the fail column.

Figure 4:
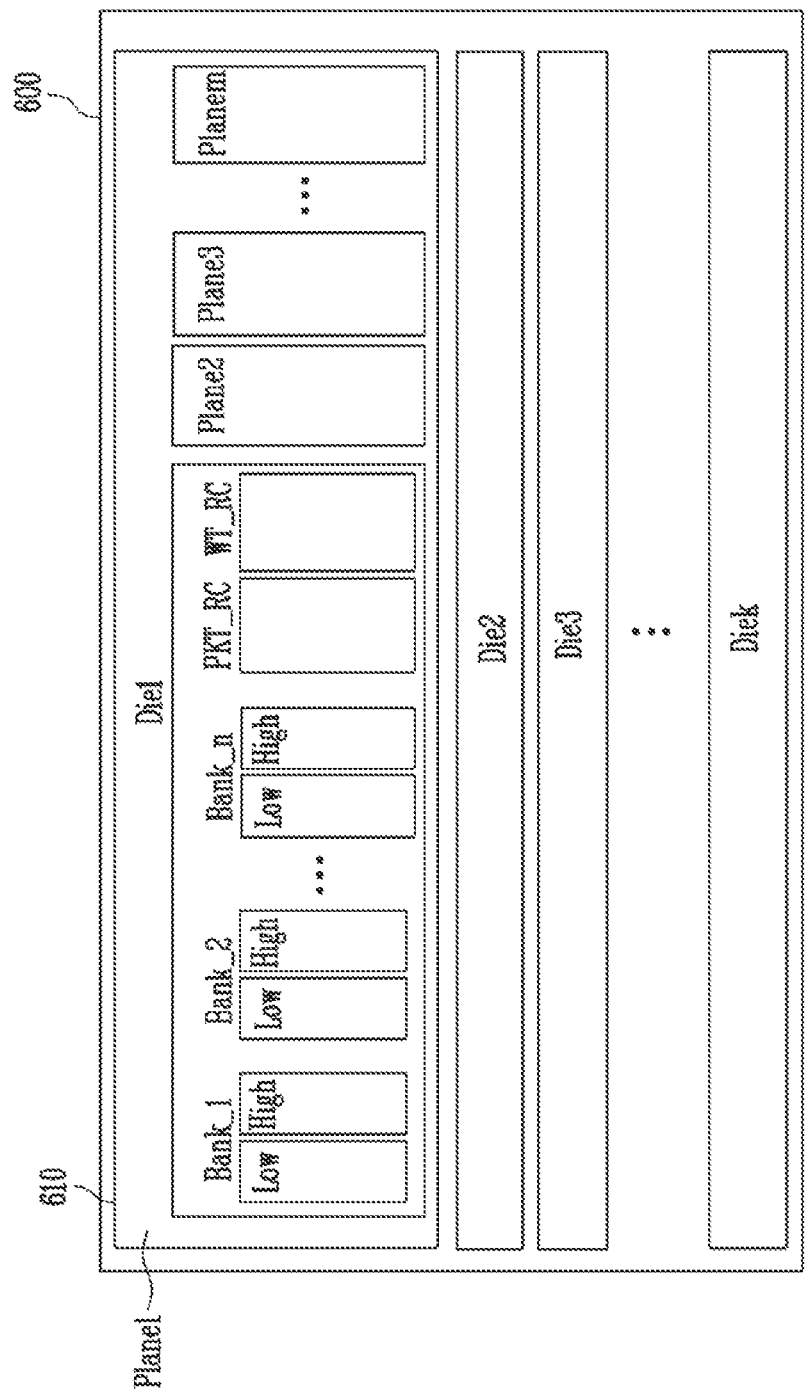
FIG. 4 is a diagram illustrating a package including a plurality of memory devices.

FIG. 4 is a diagram illustrating a package including a plurality of memory devices.

Referring to FIG. 4, the package may be configured as a structure including the plurality of memory devices. At this time, one die may be the memory device 100 described with reference to FIG. 2. Each of the plurality of dies Die1 to DieK may include a plurality of planes Plane1 to Planem. Each of the plurality of planes Plane1 to Planem may include first to n-th banks Bank_1 to Bank_n, a wafer test repair column portion WT_RC, and a packaging test repair column portion PKG_RC. The first to n-th banks Bank_1 to Bank_n may be included in the normal memory cell array area described with reference to FIG. 3. In addition, the wafer test repair column portion WT_RC and the packaging test repair column portion PKG_RC may be included in the redundancy memory cell array area described with reference to FIG. 3.

In an embodiment, during a wafer test operation, a defective column may exist among a plurality of columns to which memory cells included in each of the first to n-th banks Bank_1 to Bank_n are connected. Among the plurality of columns, the defective column may be referred to as a fail column. In a wafer test step, the detected fail column may be replaced by one of a plurality of repair columns included in the wafer test repair column portion WT_RC, and such an operation may be referred to as a repair operation. When the repair operation is performed in the wafer test step, information related to the system block described with reference to FIG. 3 may be stored.

Specifically, information on the fail column detected in the wafer test step, information on the repair column included in the replaced wafer test repair column portion WT_RC, and the like may be stored in the system block. Each information may include address information, and the address information may include information on whether a bank including a corresponding column is a low bank or a high bank. Such information may be referred to as CAM data.

In an embodiment, during a packaging test operation, among the plurality of columns to which the memory cells included in each of the first to n-th banks Bank_1 to Bank_n are connected, the fail column that is the defective column may exist. In a packaging test step, the detected fail column may be replaced by the repair column included in the packaging test repair column portion PKT_RC, and such an operation may be referred to as a repair operation. When the repair operation is performed in the packaging test step, corresponding information may be stored in the system block.

Specifically, information on the fail column detected in the packaging test step, information on the repair column included in the replaced packaging test repair column portion PKT_RC, and the like may be stored in the system block. Each information may include address information, and the address information may include information on whether a bank including a corresponding column is a low bank or a high bank. Such information may be referred to as CAM data.

Figure 5:
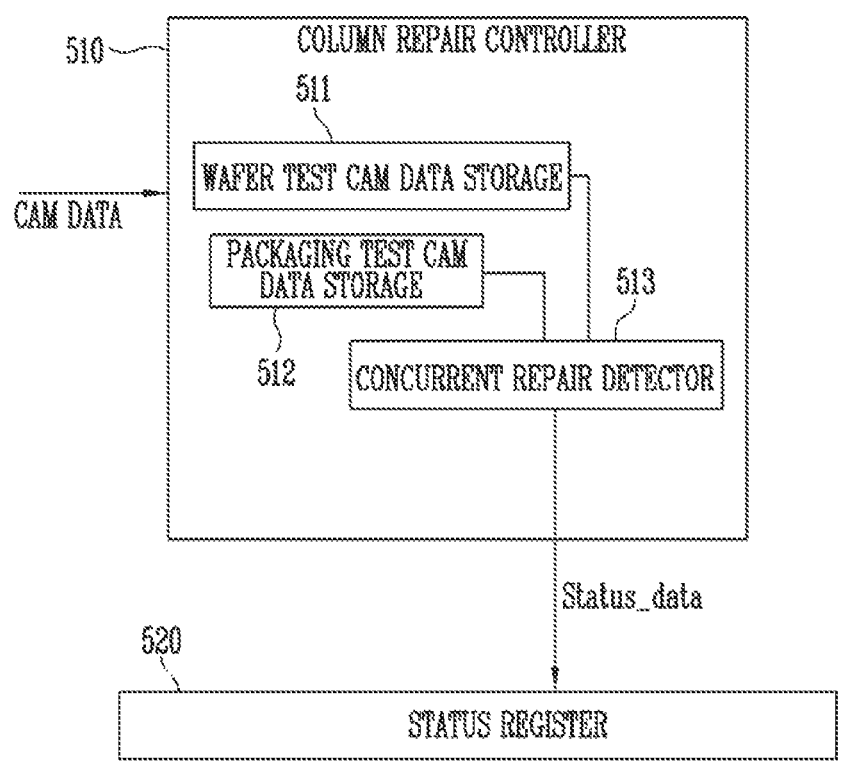
FIG. 5 is a diagram illustrating a method of detecting a concurrent repair according to an embodiment of the present disclosure.

FIG. 5 is a diagram illustrating a method of detecting a concurrent repair according to an embodiment of the present disclosure.

Referring to FIG. 5, the storage device 50 described with reference to FIG. 1 may include a column repair controller 510 and a status register 520 in order to detect a concurrent repair, also referred to as a concurrent repair column line in which a low bank column line and a high bank column line corresponding to the same column address among the plurality of low bank column lines and the plurality of high bank column lines are repaired based on the test information. The column repair controller 510 may receive CAM data CAM DATA from the system block in order to detect the concurrent repair. In addition, the column repair controller 510 may include a wafer test CAM data storage 511, also referred to as wafer test information storage, that temporarily stores wafer test CAM data included in the CAM data CAM DATA received from the system block. The column repair controller 510 may also include a packaging test CAM data storage 512, also referred to as packaging test information storage, that temporarily stores packaging test CAM data included in the CAM data CAM DATA received from the system block.

In addition, the column repair controller 510 may include a concurrent repair detector 513. The concurrent repair detector 513 may receive the wafer test CAM data and the packaging test CAM data from the wafer test CAM data storage 511 and the packaging test CAM data storage 512 to detect a concurrent repair case.

In an embodiment, a wafer test and a packaging test may be performed so that the memory device 100 described with reference to FIG. 1 may perform a normal operation. In the wafer test step, as described with reference to FIG. 4, among the plurality of columns to which the memory cells included in each of the first to n-th banks Bank_1 to Bank_n are connected, the fail column that is the defective column may exist. The fail column may be replaced by one of the plurality of repair columns included in the wafer test repair column portion WT_RC.

In the packaging test step, among the plurality of columns to which the memory cells included in each of the first to n-th banks Bank_1 to Bank_n are connected, the fail column that is the defective column may exist. The fail column may be replaced by one of the plurality of repair columns included in the packaging test repair column portion PKT_RC.

In an embodiment, after the repair operation is completed, it may be detected whether the concurrent repair case exists. An embodiment of the present disclosure assumes a memory device that does not support a concurrent repair in which both of the low bank and the high bank included in the same column are repaired.

In an embodiment, specifically, the concurrent repair case means a case where the columns included in each of the low bank and the high bank having the same address information among the first to n-th banks Bank_1 to Bank_n become the fail column and all of the columns are repaired. Specifically, one of the columns in the low bank included in the first bank Bank_1 may be repaired as the fail column. Thereafter, a column having the same address information as the previous fail column among the columns in the high bank included in the first bank Bank_1 may be repaired as the fail column. Such a case is referred to as a concurrent repair. That is, the concurrent repair means a case where the both of the column of the low bank and the column of the high bank having the same address information are repaired.

When the concurrent repair is normally processed, the system block stores address information of the fail column among the columns of the low bank included in the first bank Bank_1 and address information of the repair column replacing the corresponding fail column. In addition, the system block stores address information of the column having the same address information as the previous fail column among the columns of the high bank included in the first bank Bank_1 and address information of the repair column replacing the corresponding fail column. In an embodiment, the address information of the repair column may be address information of the column included in the wafer test repair column portion WT_RC or the packaging test repair column portion PKT_RC. Thereafter, when there is a request for the fail columns, the request is connected to each of the repair columns according to the information stored in the system block.

The memory device of the present disclosure does not support the concurrent repair operation. Therefore, when the concurrent repair occurs, access to the fail column that is concurrently repaired is failed.

For example, among the plurality of columns to which the memory cells included in each of the first to n-th banks Bank_1 to Bank_n described with reference to FIG. 4 are connected, the column included in the low bank may be detected as the fail column in the wafer test step. Thereafter, it may be assumed that the column included in the high bank having the same address is detected as the fail column in the packaging test step. At this time, a request for the fail column included in the low bank may occur. In this case, the repair column included in the packaging test repair column portion PKT_RC described with reference to FIG. 4 is accessed. Thereafter, when there is an access to the fail column included in the high bank, the fail column included in the high bank may be accessed as it is due to a characteristic of the memory device that does not support the concurrent repair. In this case, an operation on the fail column included in the high bank is failed. Therefore, in order to increase a yield of the memory device of the present disclosure, the concurrent repair case is required to be detected.

In an embodiment, in order to detect the concurrent repair case, in a step after the packaging test, a concurrent repair detection operation is performed. Referring to FIG. 5, the column repair controller 510 may receive the CAM data CAM DATA included in the system block described with reference to FIG. 3, and store data according to properties of each CAM data. Specifically, the data may be temporarily stored in the wafer test CAM data storage 511 and the packaging test CAM data storage 512. Thereafter, in order to detect the concurrent repair case, the concurrent repair detector 513 may receive wafer test CAM data from the wafer test CAM data storage 511. In addition, packaging test CAM data may be received from the packaging test CAM data storage 512. The concurrent repair detector 513 may detect the concurrent repair case through the wafer test CAM data and the packaging test CAM data. Each CAM data may include address information of the fail columns. In addition, each CAM data may include repair column address information included in the wafer test repair column portion WT_RC and the packaging test repair column portion PKT_RC respectively corresponding to the fail columns described with reference to FIG. 4.

The concurrent repair detector 513 may perform the concurrent repair detection operation to determine whether the repair operation is performed on the column included in the low bank and the column included in the high bank having the same address. The concurrent repair detector 513 may perform an exclusive OR (XOR) operation on the received wafer test CAM data and packaging test CAM data. When the addresses of the repaired columns have the same address and are different as the low bank and the high bank, respectively, the addresses may be detected as the concurrent repair through the XOR operation.

In an embodiment, the concurrent repair detector 513 may generate concurrent repair information Status_data according to the concurrent repair detection operation. The generated concurrent repair information Status_data may be stored in a status register 520. The concurrent repair information Status_data may be "pass" rather than "fail" when the repair operation is performed on the column included in the low bank and the column included in the high bank having the same address. The concurrent repair information Status_data stored in the status register 520 may be requested from the memory controller 200 described with reference to FIG. 1.

In an embodiment, the column repair controller 510 and the status register 520 may be included in the control logic 130 described with reference to FIG. 2.

Figure 6:
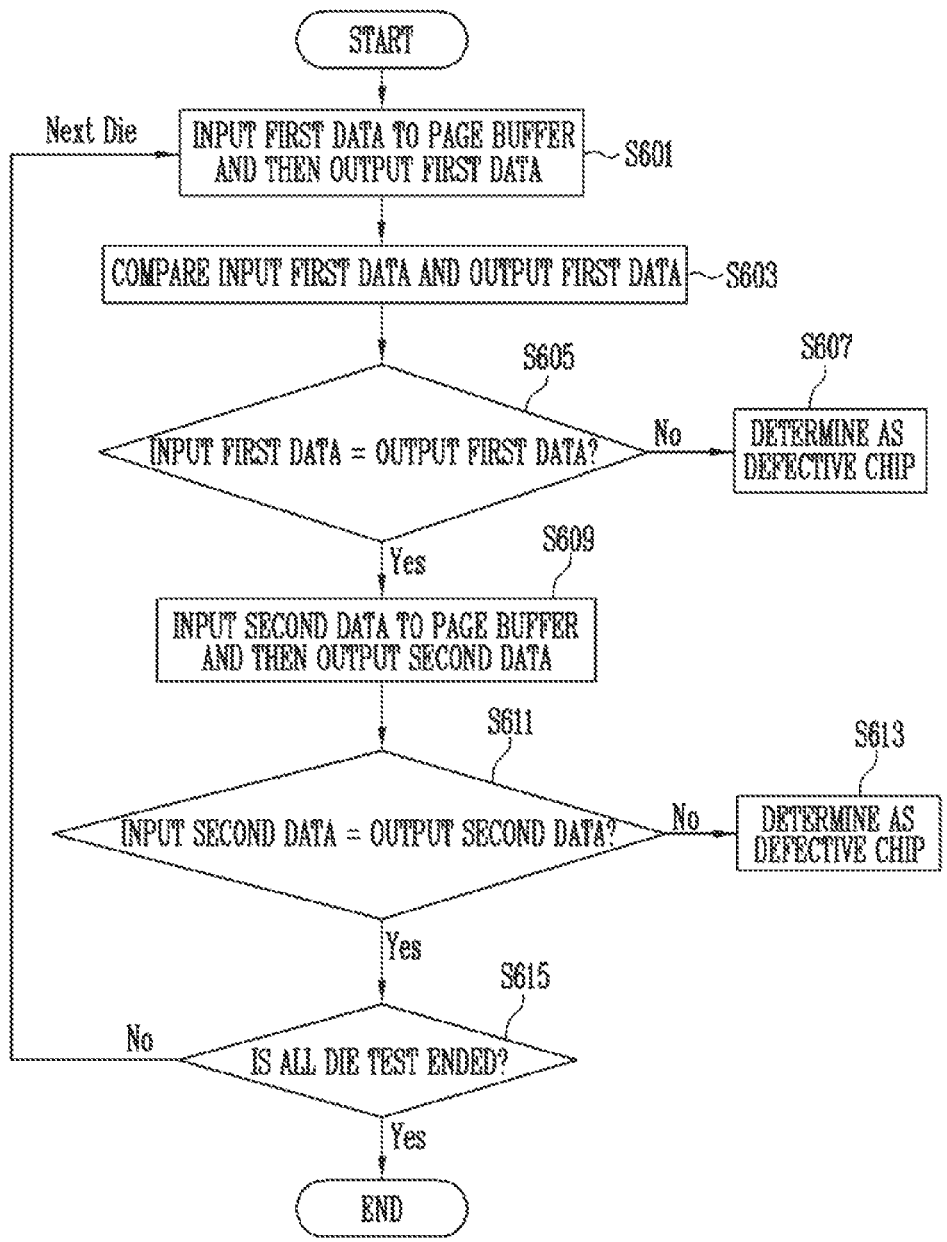
FIG. 6 is a flowchart illustrating a method of detecting a concurrent repair case through data input/output.

FIG. 6 is a flowchart illustrating a method of detecting the concurrent repair case through data input/output.

Referring to FIG. 6, after the packaging test step, the concurrent repair case may be detected using a page buffer. When the concurrent repair occurs, the memory device 100 described with reference to FIG. 1 may input data and fail to output the stored data. Therefore, after data is input to the page buffer, the data may be output, and the concurrent repair case may be detected by comparing whether the input data and the output data are the same.

For example, in step S601, the control logic 130 described with reference to FIG. 2 controls to input and output first data to and from the page buffer included in the memory cell array 110 described with reference to FIG. 2. Thereafter, in step S602, the input first data and output second data may be compared. In step S603, when the input first data and the output first data are not the same, it may be regarded that the concurrent repair occurs, and in step S607, it may be determined as the defective chip. In step S605, when the input first data and the output first data are the same, the second data may be input to the page buffer and then output in step S609. Thereafter, in step S611, the input second data and the output second data may be compared. In step S611, when the input second data and the output second data are not the same, it may be regarded that the concurrent repair occurs, and in step S613, it may be determined as the defective chip. In step S615, when the input second data and the output second data are the same, in step S615, it may be determined whether a test for all dies described with reference to FIG. 3 is ended. Thereafter, when the test for all dies are ended, the concurrent repair detection operation may be ended. According to the concurrent repair detection operation shown in FIG. 6, because a data input operation, an output operation, and a comparison operation are required to be repeatedly performed, there is a disadvantage that it takes a long time.

Figure 7:
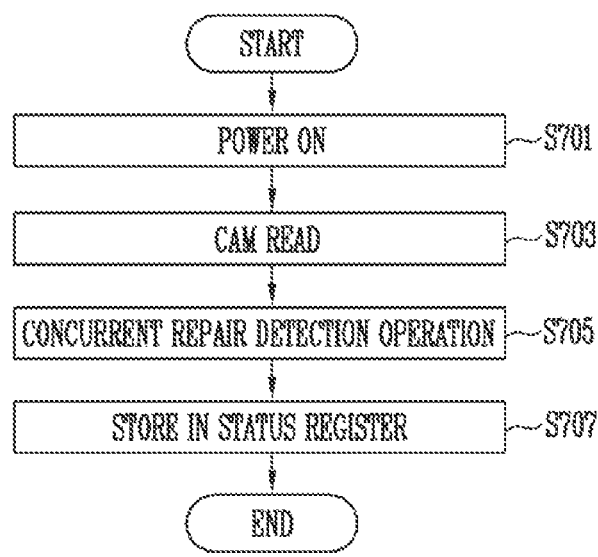
FIG. 7 is a flowchart illustrating a method of detecting the concurrent repair case using CAM data of a system block.

FIG. 7 is a flowchart illustrating a method of detecting the concurrent repair case using the CAM data of the system block.

Referring to FIG. 7, in step S701, the memory device 100 described with reference to FIG. 2 may perform the concurrent repair case detection operation by turning on power. In step S703, the control logic 130 described with reference to FIG. 2 may control the peripheral circuit 120 to read the CAM data CAM DATA stored in the system block included in the memory cell array 110. In step S705, the control logic 130 may perform the concurrent repair detection operation using the wafer test CAM data and the packaging test CAM data included in the read CAM data. In step S705, the performed concurrent repair detection operation may be the same as the concurrent repair operation described with reference to FIG. 5. Thereafter, in step S707, the concurrent repair detector 513 included in the column repair controller 510 described with reference to FIG. 5 may store a result of the concurrent repair detection operation, which is performed in step S705, in the status register 520.

Figure 8:
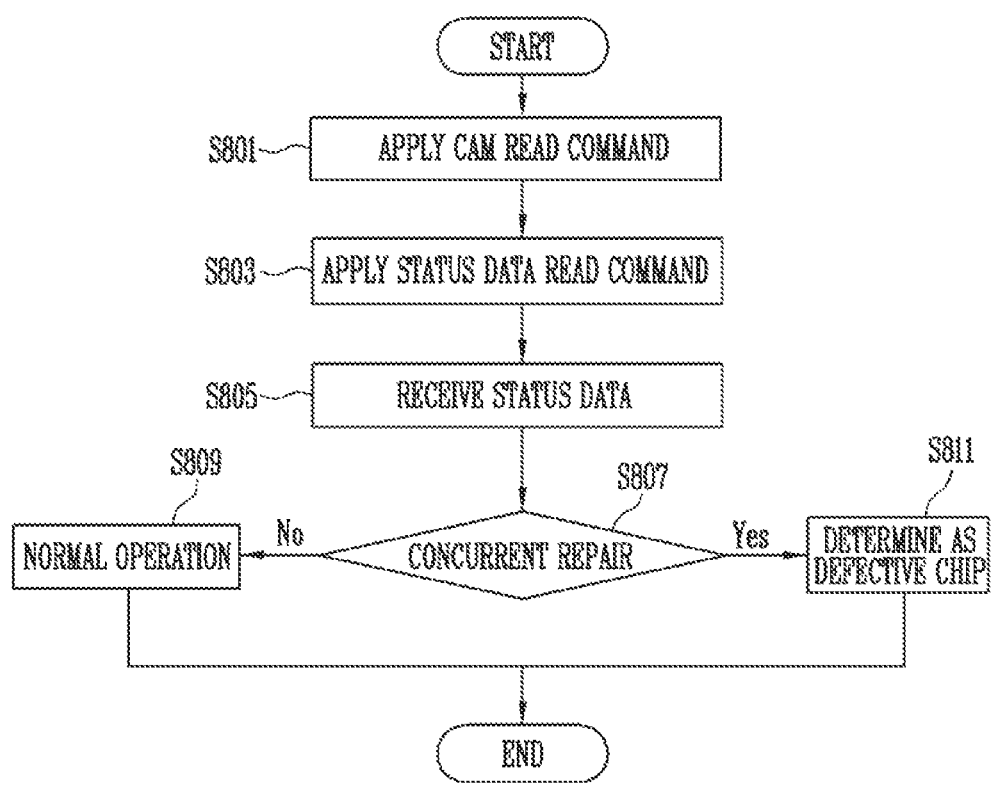
FIG. 8 is a flowchart illustrating a method of operating a memory controller of FIG. 1.

FIG. 8 is a flowchart illustrating a method of operating the memory controller of FIG. 1.

Referring to FIG. 8, in step S801, after the packaging test step, in order to detect the concurrent repair case, the memory controller 200 may apply a CAM read command to the memory device 100 described with reference to FIG. 1. According to the CAM read command, the memory device 100 may perform the concurrent repair detection operation. Thereafter, in step S803, the memory controller 200 may apply a read command of the concurrent repair information Status_data to the memory device 100. According to the read command of the concurrent repair information Status_data, the concurrent repair information Status_data included in the status register 520 described with reference to FIG. 5 may be output to the memory controller 200. In step S805, the memory controller 200 may receive the concurrent repair information Status_data from the memory device 100. In step S807, the memory controller 200 may determine whether the concurrent repair occurs through the received concurrent repair information Status_data.

For example, the concurrent repair information Status_data may indicate "fail" in a case of the concurrent repair case and indicate "pass" in a case where it is not the concurrent repair case. Therefore, when the received concurrent repair information Status_data is "fail", the memory controller 200 may find the concurrent repair case. In step S807, when concurrent repair occurs, the memory controller 200 may determine a corresponding chip as the defective chip in step S811. In step S807, when it is not the concurrent repair, the memory controller 200 may perform the normal operation in step S809. The normal operation may include the read operation, the program operation, and the erase operation.

Figure 9:
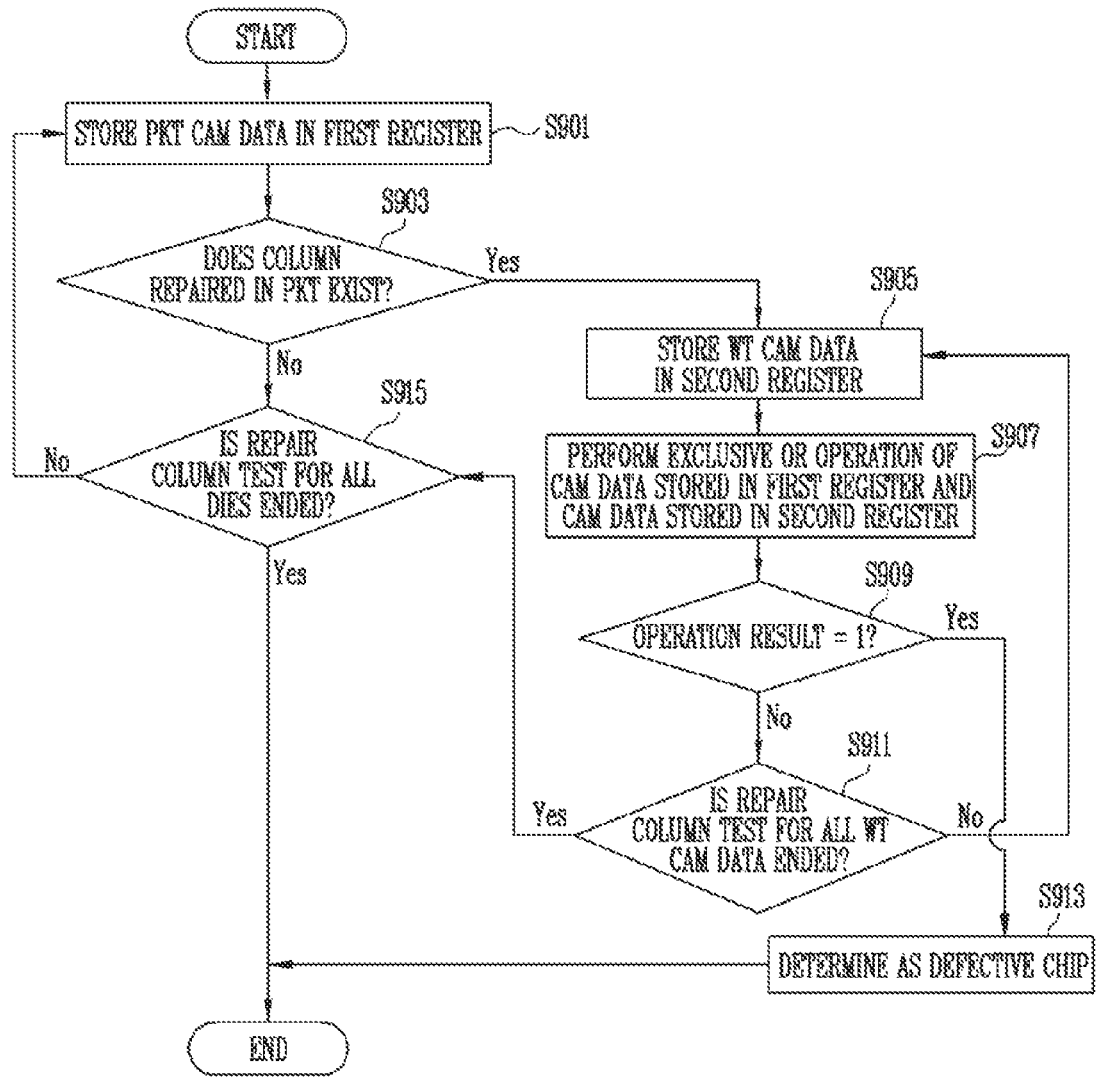
FIG. 9 is a flowchart illustrating a method of comparing the CAM data of the system block in order to detect the concurrent repair.

FIG. 9 is a flowchart illustrating a method of comparing the CAM data of the system block in order to detect the concurrent repair.

Referring to FIG. 9, the column repair controller 510 described with reference to FIG. 5 may perform the concurrent repair case detection operation by comparing the CAM data of the system block. In step S901, the column repair controller 510 may receive packaging test (PKT) CAM data for a fail column-repair column detected in the packaging test step from the system block described with reference to FIG. 3 and store the packaging test (PKT) CAM data in a first register. Thereafter, in step S903, it may be checked whether the column repaired in the packaging test exists by using the packaging test CAM data stored in the first register. In step S903, when the repaired column exists, in step S905, wafer test (WT) CAM data for the fail column-repair column detected in the wafer test step may be received from the system block described with reference to FIG. 3 and may be stored in a second register.

In step S907, an exclusive OR operation of the CAM data stored in the first register and the CAM data stored in the second register may be performed. That is, whether the fail column occurs in the low bank and the high bank having the same address and the repair operation is performed may be detected through the exclusive OR operation. In step S909, when an operation result is 1, it may be determined that the fail column occurs in the low bank and the high bank having the same address and the repair operation is performed. In this case, in step S913, it may be determined as the defective chip. In step S909, when the result of the exclusive OR operation is 0, in step S911, it is determined whether the test for all columns included in the wafer test repair column portion WT_RC described with reference to FIG. 4 is completed.

Thereafter, when the test for all wafer test CAM data is completed, in step S915, it may be checked whether a repair column test for all packaging test data included in the plurality of dies Die1 to Diek described with reference to FIG. 4 is completed, that is, a test for all of the plurality of dies Die1 to Diek is completed, and the test may be ended.

Figure 10:
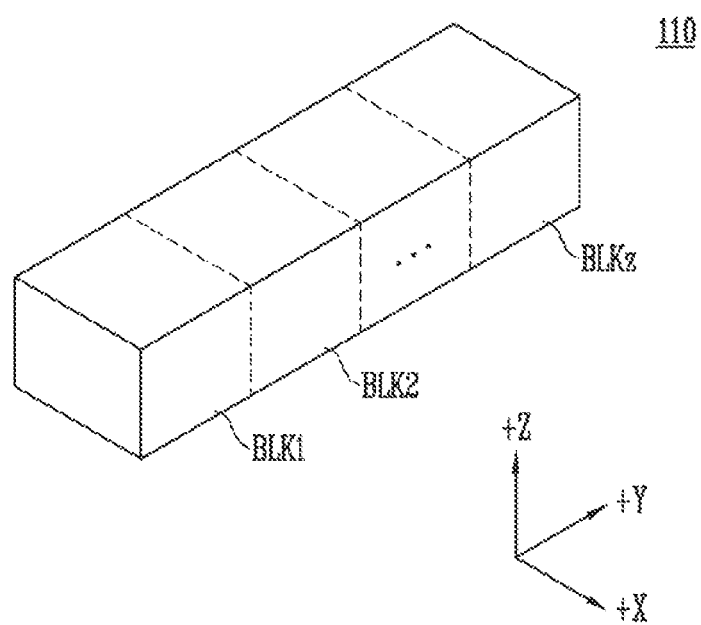
FIG. 10 is a diagram illustrating an embodiment of a memory cell array of FIG. 2.

FIG. 10 is a diagram illustrating an embodiment of the memory cell array of FIG. 2.

Referring to FIG. 10, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 11 to 13.

Figure 11:
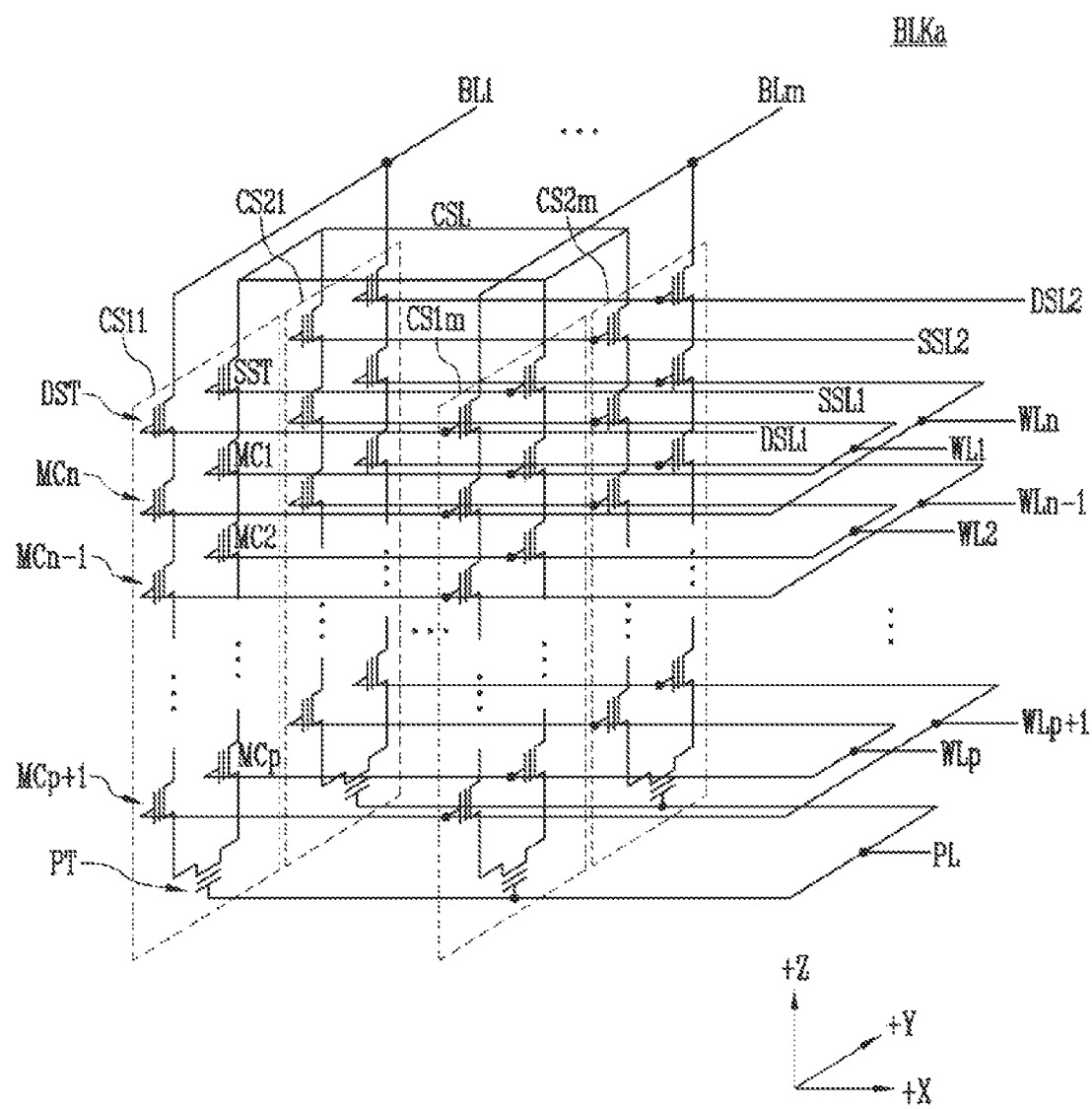
FIG. 11 is a circuit diagram illustrating any one memory block BLKa among memory blocks BLK1 to BLKz of FIG. 10.

FIG. 11 is a circuit diagram illustrating any one memory block BLKa among the memory blocks BLK1 to BLKz of FIG. 10.

Figure 12:
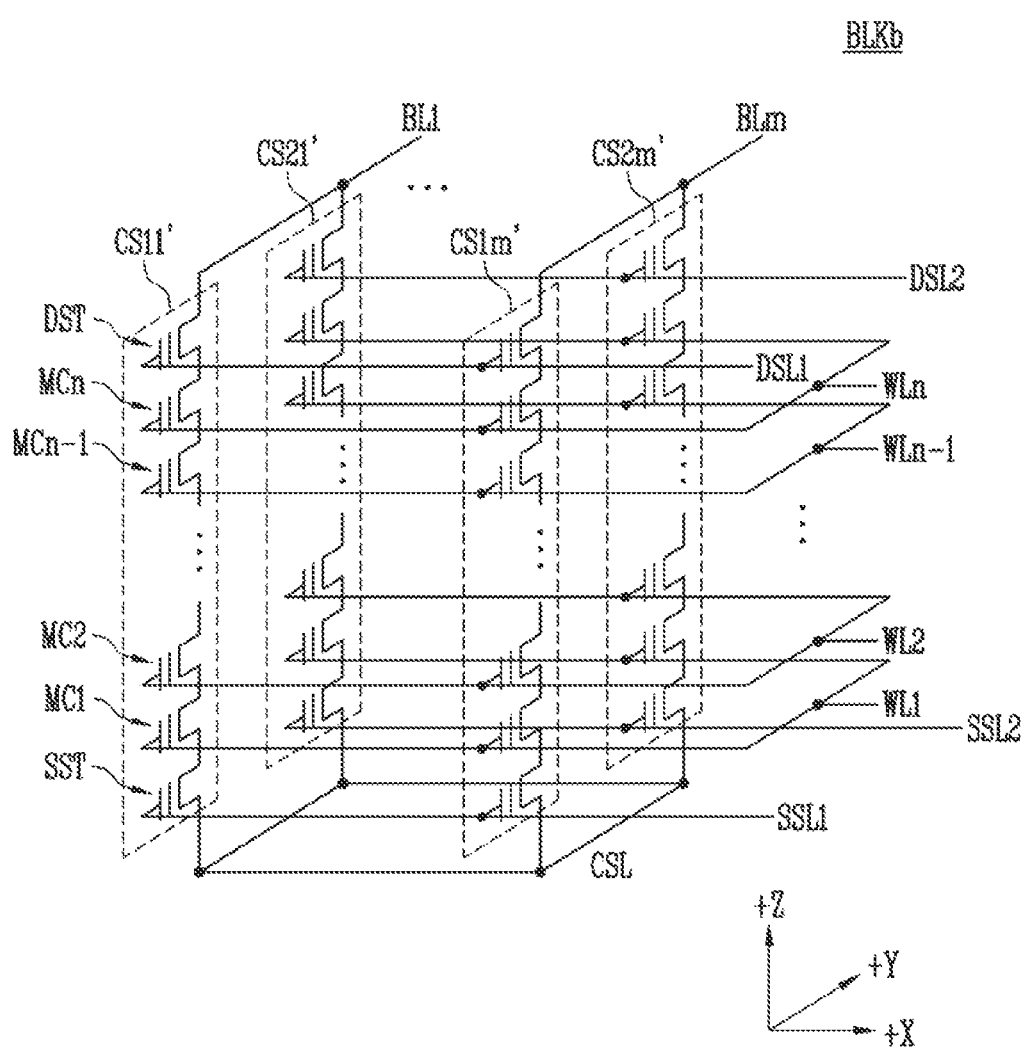
FIG. 12 is a diagram illustrating a structure of any one memory block BLKb among the memory blocks BLK1 to BLKz of FIG. 10.

Referring to FIG. 11, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 12, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistors SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 11, the source select transistors of the cell strings CS11 to CS1$m$ of a first row are connected to a first source select line SSL1. The source select transistors of the cell strings CS21 to CS2$m$ of a second row are connected to a second source select line SSL2.

As another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 12, the cell strings CS11 and CS21 of the first column are connected to the first bit line BL1. The cell strings CS1$m$ and CS2$m$ of the m-th column are connected to the m-th bit line BL$m$. In an embodiment, the first to m-th bit lines BL1 to BL$m$ may correspond to the first to n-th bit lines BL1 to BL$n$ described with reference to FIG. 10.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BL$m$. In addition, even-numbered cell strings among the cell strings CS11 to CS1$m$ or CS21 to SC2$m$ arranged in the row direction may be connected to the even bit lines, and odd-numbered cell strings among the cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one or more dummy memory cells are provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

FIG. 12 is a diagram illustrating a structure of any one memory block BLKb among the memory blocks BLK1 to BLKz of FIG. 10.

Referring to FIG. 12, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. As another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to the memory block BLKa of FIG. 11 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 13:
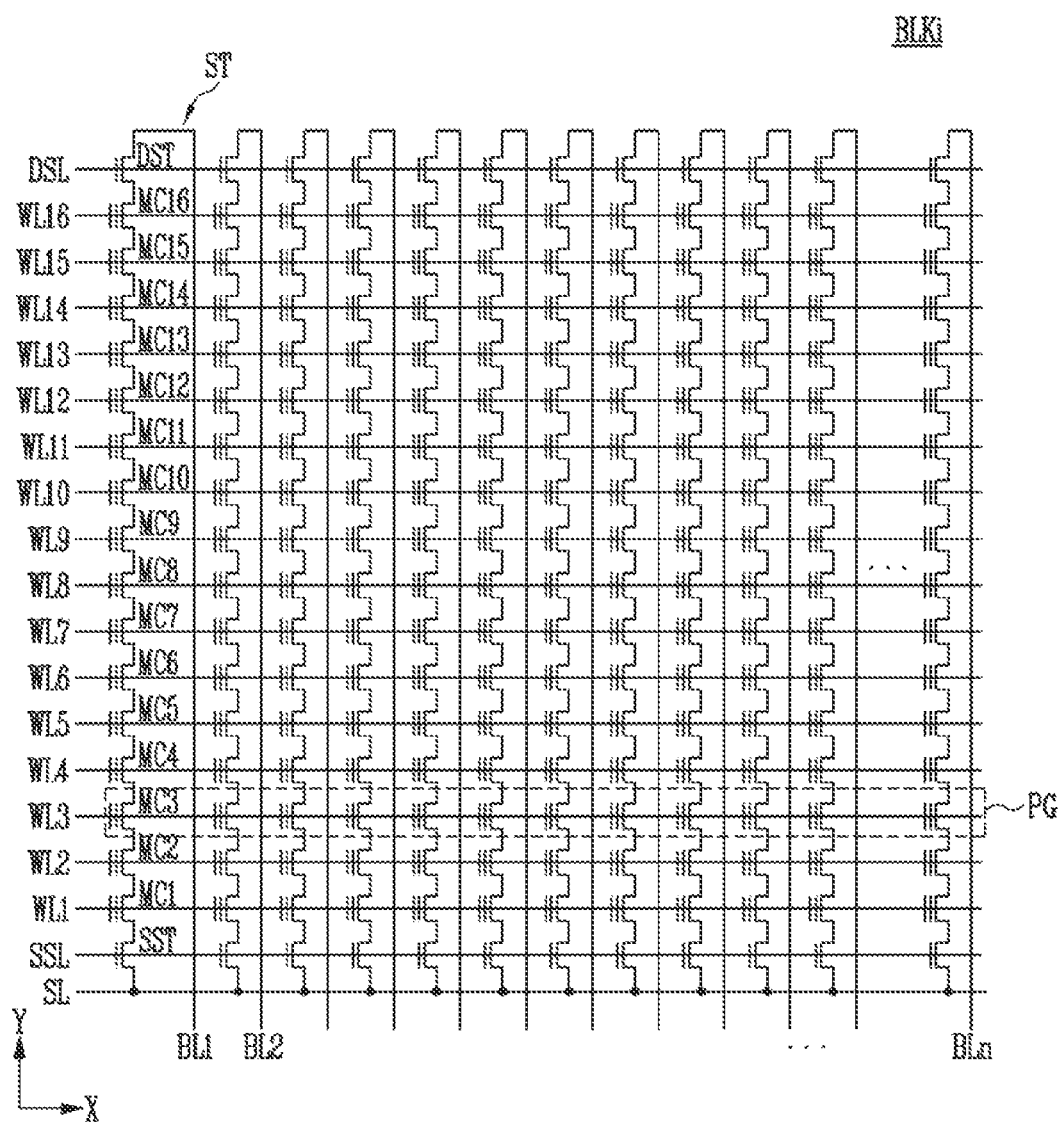
FIG. 13 is a diagram illustrating a structure of any one memory block BLKi among the memory blocks BLK1 to BLKz of FIG. 10.

FIG. 13 is a diagram illustrating a structure of any one memory block BLKi among the memory blocks BLK1 to BLKz of FIG. 10.

Referring to FIG. 13, a plurality of word lines arranged in parallel with each other may be connected between the first select line and the second select line. Here, the first select line may be the source select line SSL, and the second select line may be the drain select line DSL. More specifically, the memory block 110 may include a plurality of strings ST connected between the bit lines BL1 to BLn and the source line SL. The bit lines BL1 to BLn may be connected to the strings ST, respectively, and the source line SL may be commonly connected to the strings ST. Because the strings ST may be configured to be identical to each other, a string ST connected to the first bit line BL1 will be specifically described, as an example.

The string ST may include the source select transistor, a plurality of memory cells MC1 to MC16, and a drain select transistor DST connected in series between the source line SL and the first bit line BL1. One string ST may include at least one source select transistor SST, at least one drain select transistors DST, and the memory cells MC1 to MC16 more than the number shown in the drawing.

A source of the source select transistor SST may be connected to the source line SL and a drain of the drain select transistor DST may be connected to the first bit line BL1. The memory cells MC1 to MC16 may be connected in series between the source select transistor SST and the drain select transistor DST. Gates of the source select transistor SST included in the different strings ST may be connected to the source select transistor SST, gates of the drain select transistors may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKi may include the pages PG of the number of the word lines WL1 to WL16.

One memory cell may store one bit of data. This is commonly called a single-level cell (SLC). In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

Figure 14:
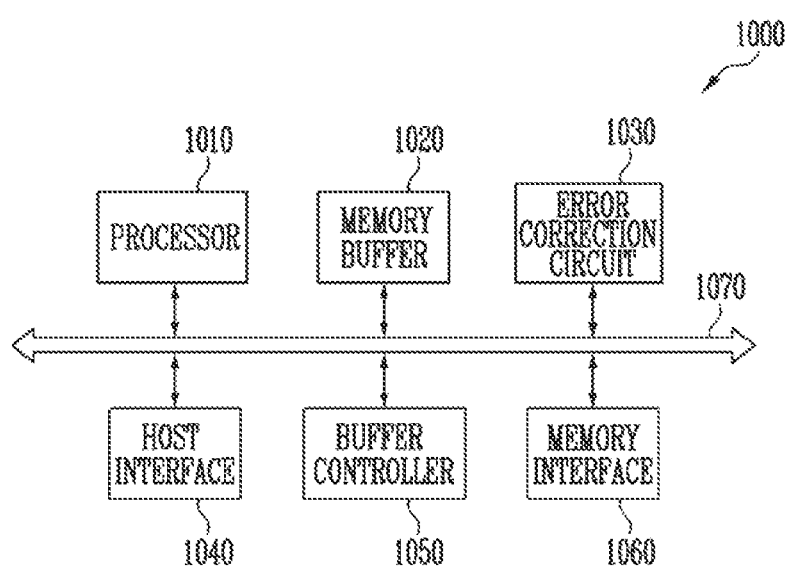
FIG. 14 is a diagram illustrating an embodiment of a memory controller of FIG. 1.

FIG. 14 is a diagram illustrating an embodiment of the memory controller of FIG. 1.

The memory controller 1000 is connected to a host Host and the memory device. The memory controller 1000 is configured to access the memory device in response to the request from the host Host. For example, the memory controller 1000 is configured to control the write, read, erase, and background operations of the memory device. The memory controller 1000 is configured to provide an interface between the memory device and the host Host. The memory controller 1000 is configured to drive firmware for controlling the memory device.

Referring to FIG. 14, the memory controller 1000 may include a processor 1010, a memory buffer 1020, an error correction circuit (ECC) 1030, a host interface 1040, a buffer controller (a buffer control circuit) 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the FTL. The FTL may receive the LBA using a mapping table and convert the LBA into the PBA. An address mapping method of the FTL includes several address mapping methods according to a mapping unit. Representative address mapping methods include a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include static RAM (SRAM) or dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data received from the memory device through the memory interface 1060. For example, the ECC 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI-E), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1202, and the memory interface 1060.

Figure 15:
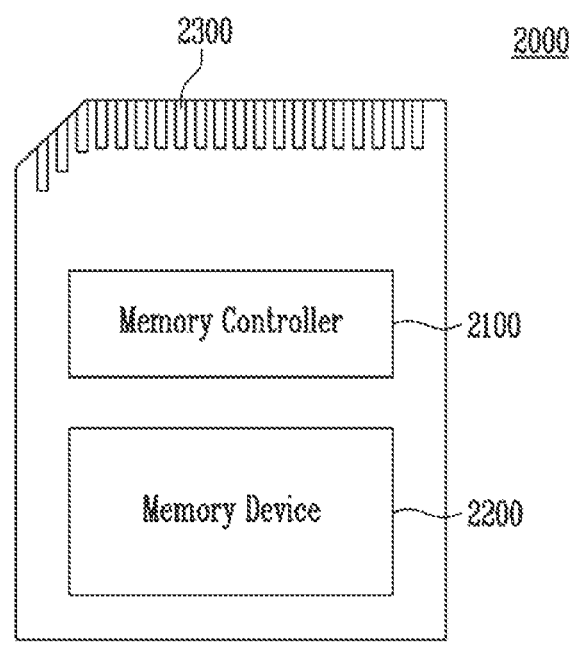
FIG. 15 is a block diagram illustrating a memory card system to which the memory device according to an embodiment of the present disclosure is applied.

FIG. 15 is a block diagram illustrating a memory card system to which the storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as a random access memory (RAM) component, a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured with various types of non-volatile memory, such as electrically erasable and programmable ROM (EEPROM), NAND flash memory, NOR flash memory, phase-change RAM (PRAM), resistive RAM (ReRAM), ferroelectric RAM (FRAM), or spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 16:
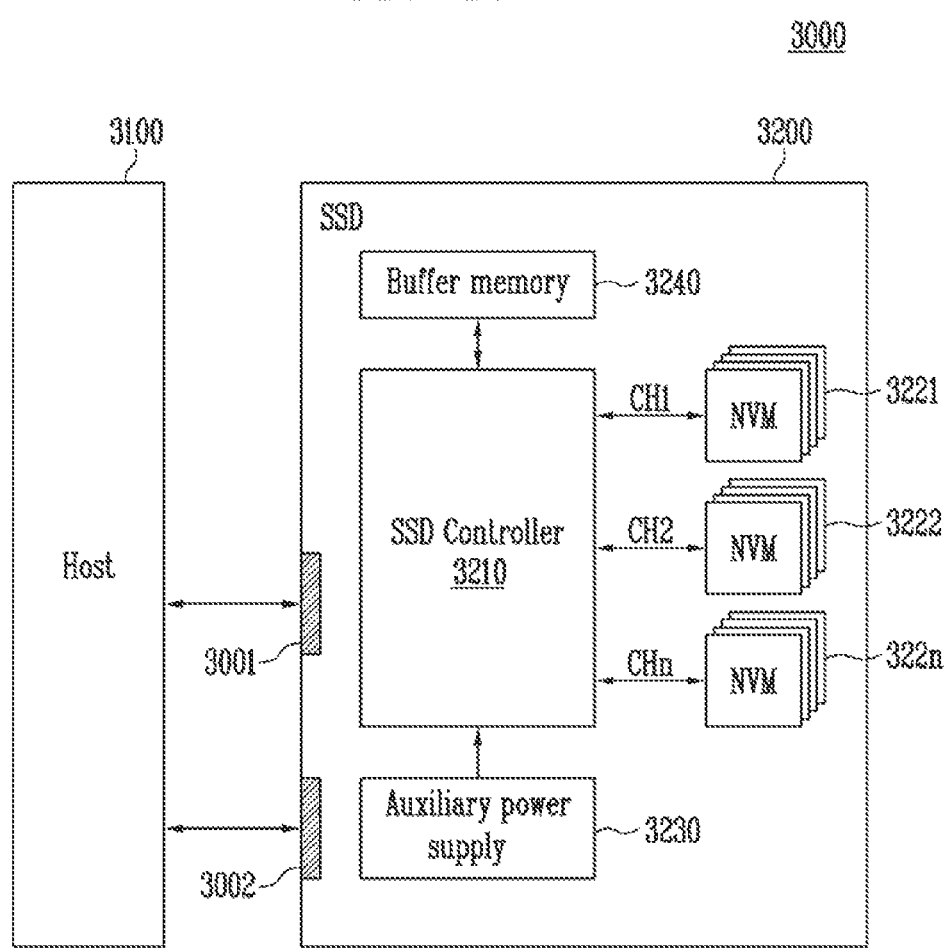
FIG. 16 is a block diagram illustrating a solid state drive (SSD) system to which the memory device according to an embodiment of the present disclosure is applied.

FIG. 16 is a block diagram illustrating a solid state drive (SSD) system to which the storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include volatile memory, such as DRAM, SDRAM, DDR SDRAM, LPDDR SDRAM, or GRAM, or may include non-volatile memory such as FRAM, ReRAM, STT-MRAM, or PRAM.

Figure 17:
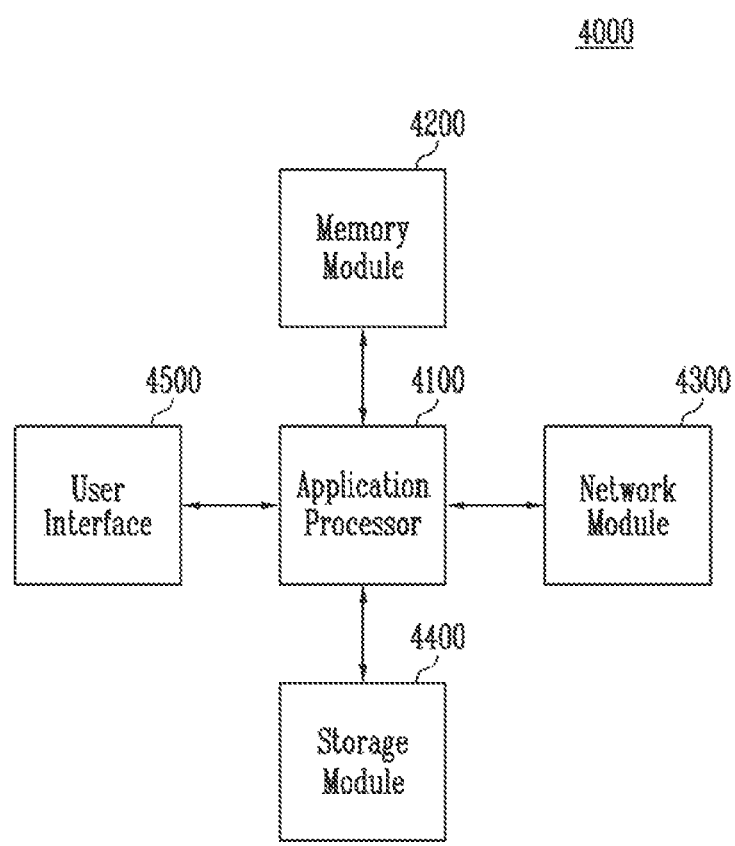
FIG. 17 is a block diagram illustrating a user system to which the memory device according to an embodiment of the present disclosure is applied.

FIG. 17 is a block diagram illustrating a user system to which the storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include volatile random access memory, such as DRAM, SDRAM, DDR SDRAM, DDR2 SDRAM, DDR3 SDRAM, LPDDR SDARM, LPDDR2 SDRAM, or LPDDR3 SDRAM, or may include non-volatile random access memory, such as PRAM, ReRAM, MRAM, or FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented with non-volatile semiconductor memory, such as phase-change RAM (PRAM), magnetic RAM (MRAM), resistive RAM (RRAM), NAND flash, NOR flash, or a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a system block for storing test information;
   a data block including memory cells connected to a plurality of low bank column lines and a plurality of high bank column lines; and
   a column repair controller configured to detect, based on the test information, a concurrent repair column line in which a low bank column line among the plurality of low bank column lines and a high bank column line among the plurality of high bank column lines corresponding to the same column address are concurrent repaired.

2. The memory device of claim 1, wherein the column repair controller comprises:
   a wafer test information storage configured to temporarily store wafer test information among information included in the test information;
   a packaging test information storage configured to temporarily store packaging test information among the information included in the test information; and
   a concurrent repair detector configured to generate concurrent repair information, which is a result of comparing the wafer test information and the packaging test information.

3. The memory device of claim 2, further comprising:
a status register configured to store the concurrent repair information.

4. The memory device of claim 2, wherein the wafer test information storage stores a column address of a column line repaired in a wafer test of the memory device among the plurality of low bank column lines and the plurality of high bank column lines.

5. The memory device of claim 2, wherein the packaging test information storage stores a column address of a column line repaired in a packaging test of the memory device among the plurality of low bank column lines and the plurality of high bank column lines.

6. The memory device of claim 2, wherein the concurrent repair detector is configured to perform an exclusive OR operation on the wafer test information and the packaging test information.

7. A method of operating a memory device including a system block for storing test information and a data block including memory cells connected to a plurality of low bank column lines and a plurality of high bank column lines, the method comprising:
storing packaging test information, which is included in test data stored in the system block, in a first register;
storing wafer test information, which is included in the test data stored in the system block, in a second register; and
detecting, based on the wafer test information and the packaging test information, a concurrent repair column line in which a low bank column line among the plurality of low bank column lines and a high bank column line among the plurality of high bank column lines corresponding to the same column address are concurrent repaired.

8. The method of claim 7, wherein detecting a concurrent repair column line comprises:
determining whether a repair column line exists based on the packaging test information stored in the first register;
performing an exclusive OR operation with the packaging test information based on the wafer test information stored in the second register;
storing result information of the exclusive OR operation in a status register; and
determining the memory device as a defective chip according to the result information of the exclusive OR operation stored in the status register.

9. The method of claim 7, further comprising:
determining whether an exclusive OR operation on address information respectively corresponding to a plurality of repair columns included in the wafer test information is performed with address information corresponding to a repair column included in the packaging test information; and
storing wafer test information corresponding to address information on which the exclusive OR operation is not performed with the address information corresponding to the repair column included in the packaging test information among the address information respectively corresponding to the plurality of repair columns included in the wafer test information, in the second register.

10. The method of claim 7, wherein detecting further comprises:
determining whether an exclusive OR operation is performed on all packaging test information included in the system block; and
storing packaging test information on which the exclusive OR operation is not performed among the packaging test information included in the system block, in the first register.

11. The method of claim 7, wherein storing the packaging test information, which is included in the test data stored in the system block, in the first register comprises storing column address information of a column line repaired in a packaging test of the memory device among the plurality of low bank column lines and the plurality of high bank column lines.

12. The method of claim 7, wherein storing the wafer test information, which is included in the test data stored in the system block, in the second register comprises storing column address information of a column line repaired in a wafer test of the memory device among the plurality of low bank column lines and the plurality of high bank column lines.

13. The method of claim 7, further comprising:
generating concurrent repair information based on detecting the concurrent repair column line; and
storing the concurrent repair information in a status register.

14. The method of claim 13, further comprising:
determining the memory device as a defective chip based on the concurrent repair information stored in the status register.

* * * * *